United States Patent [19]
Frenkil et al.

[11] Patent Number: 5,193,072
[45] Date of Patent: Mar. 9, 1993

[54] HIDDEN REFRESH OF A DYNAMIC RANDOM ACCESS MEMORY

[75] Inventors: Gerald L. Frenkil, Brookline; Steven E. Golson, Carlisle, both of Mass.

[73] Assignee: VLSI Technology, Inc., San Jose, Calif.

[21] Appl. No.: 631,618

[22] Filed: Dec. 21, 1990

[51] Int. Cl.$^5$ .................................... C11C 11/40
[52] U.S. Cl. ............................ 365/222; 365/233; 365/189.01
[58] Field of Search ............... 365/222, 189.01, 233

[56] References Cited

U.S. PATENT DOCUMENTS 3,685,027  8/1972  Allen et al. .
3,737,879  6/1973  Greene et al. .................. 365/222
4,207,618  7/1980  White, Jr. et al. .

OTHER PUBLICATIONS

Chu, et al, *A 5V 4K×8 Quasi Static RAM*, 1979, IEEE ISSCC, pp. 156–157.
Eaton, et al, *A 100ns 64K Dynamic RAM using Redundancy Techniques*, 1981, IEEE ISSCC, pp. 84, 85.
Reese, et al, *A 4K×8 Dynamic RAM with Self Refresh*, 1981, IEEE ISSCC. pp. 88, 89.

*Primary Examiner*—Terrell W. Fears
*Attorney, Agent, or Firm*—Douglas L. Weller

[57] ABSTRACT

A DRAM allows for hidden refresh of its memory cells. The refresh is performed during a refresh cycle at the beginning of a clock cycle. Immediately before the beginning of each clock cycle the DRAM selects a word line for a row of memory cells for which a data access is to be performed. The DRAM also selects at least one word line for at least one row of memory cells for which a refresh is to be performed. During the refresh cycle, a refresh is performed on every memory cell row which is selected for data access or which is selected for refresh. After the refresh cycle, during a data access segment of the clock cycle, the DRAM continues to select the word line for the row of memory cells for which a data access is to be performed; however, the DRAM no longer selects the at least one word line for at least one row of memory cells selected for refresh. During the data access segment of the clock cycle, the data access is performed on the row of memory cells which remain selected.

19 Claims, 4 Drawing Sheets

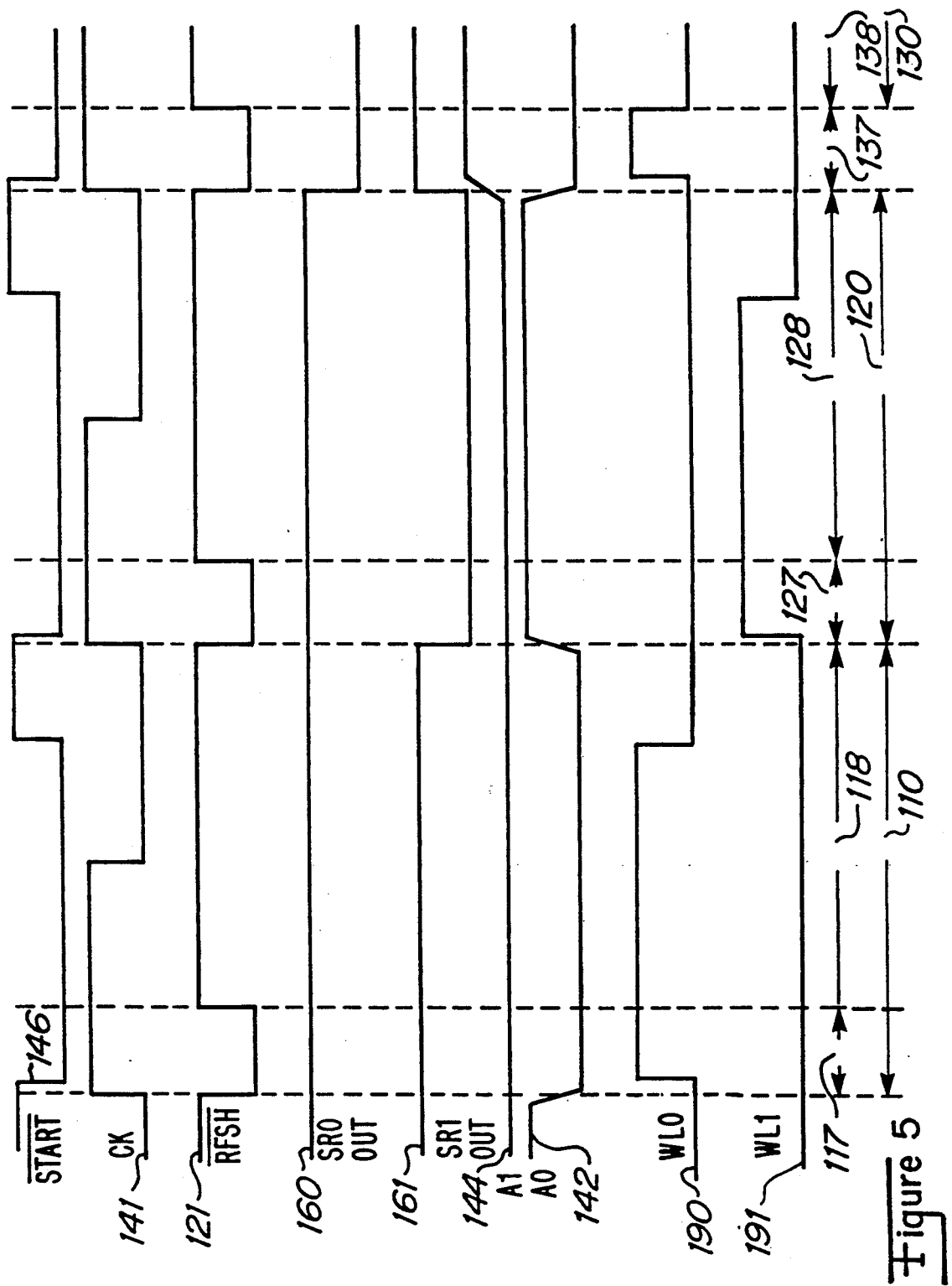

HIDDEN REFRESH OF A DYNAMIC RANDOM ACCESS MEMORY

BACKGROUND

The present invention concerns the refresh of a charge stored in a cross-coupled, four transistor dynamic random access memory (DRAM).

DRAMs may be designed to have a greater density than static random access memories (SRAM). However, it is necessary to periodically refresh DRAMs to recharge memory cells.

In the prior art, DRAMs have typically been refreshed using external logic. This external logic generally includes an interval timer which determines when a refresh cycle is needed. During the refresh cycle the external logic generates refresh control signals. The control signals cause a row-address strobe (RAS) command to simultaneously be sent to DRAMs. Also, the control signals cause each DRAM to cycle through all their row addresses in order to refresh every cell.

Some DRAMs have been designed to use internal logic to perform a refresh in response to a signal from external circuitry. See, for example, Eaton, et al., *A 100 Nanosecond 64K Dynamic RAM using Redundancy Techniques*, 1981 ISSCC. These DRAMs include a refresh counter used to internally generate refresh addresses.

Other DRAMs have been designed with a "self-refresh" mode. See for example, Reese, et al., *A 4K×8 Dynamic RAM with Self Refresh*, 1981 ISSCC. When in self-refresh mode, the DRAM will refresh its memory cells without direction from an external circuit. However, while the DRAM is in the self-refresh mode, the DRAM locks out memory accesses.

One design of a DRAM has been referred to as a "quasi-static" RAM. See Chu, et al., *A 5 Volt 4K×8 Quasi Static Ram*, IEEE ISSCC, 1979, p. 156. Each of these DRAMs includes all refresh circuitry needed to refresh its memory cells; however, the DRAM will lock out external memory accesses which will interfere with a refresh operation. In this design, the DRAM memory cells are split into two arrays. These arrays are multiplexed so that while one of the arrays is being accessed, the other array is being refreshed. As long as there is roughly an equal number of accesses from both arrays, the DRAM is able to keep all its memory cells refreshed. However, if the there are a long string of address accesses from the same array, the DRAM will have to signal the external circuitry that it must perform an internal refresh. The DRAM locks out memory accesses and performs the refresh of the array of memory cells.

The above-discussed DRAMs all have certain disadvantages. Generally, the DRAMs require external circuitry to manage the refresh operation. When there is no refresh support internally on the DRAM, the external circuitry must include address counters and timers. When the external circuitry is minimized or eliminated, there are occasions when the DRAMs must lock out memory accesses in order to complete a refresh cycle.

SUMMARY OF THE INVENTION

In accordance with the preferred embodiment of the present invention, a DRAM is presented which allows for hidden refresh of its memory cells. The refresh is performed during a refresh cycle at the beginning of a clock cycle. The clock cycle may be controlled, for example, by a clock signal generated external to the DRAM such as a system clock.

Immediately before the beginning of each clock cycle the DRAM selects a word line for a row of memory cells for which a data access is to be performed. A data access is either a read operation or a write operation. The DRAM also selects at least one word line for at least one row of memory cells for which a refresh is to be performed. These rows of memory cells may overlap, that is, if only one row of memory cells is to be refreshed and the selected row is the same row of memory cells on which a data access is to be performed only the single word line for that row of memory cells is selected.

The beginning segment of the clock cycle is generally used as the refresh cycle. During the refresh cycle, a refresh is performed on every memory cell row which is selected for data access or which is selected for refresh. After the refresh cycle, during a data access segment of the clock cycle, the DRAM continues to select the word line for the row of memory cells for which a data access is to be performed; however, the DRAM no longer selects the at least one word line for at the least one row of memory cells selected for refresh. During the data access segment of the clock cycle, the data read or the data write is performed on the row of memory cells which remain selected.

A shift register may be used to select rows of memory cells for refresh. Each word line has associated with it a one-bit shifter from the shift register. The output on the one-bit shifter determines whether the row of memory cells for a word line is to be refreshed. The shift register is shifted once each clock cycle so that different rows of memory cells are selected for refresh during each clock cycle.

The present invention has several advantageous features. For example, dependent upon the value initially placed in the shift register, several rows of memory cells may be refreshed during each clock cycle. Further, the refresh cycle serves to pre-charge memory cells which are to be read during a following data access segment of a clock cycle. Additionally, circuitry required to implement the refresh cycle is low. Finally, with only the addition of an externally generated clock signal, the present invention allows a DRAM to mimic the operation of a static RAM. This is a significant because a DRAM requires less circuitry per memory cell than a static RAM, and is thus significantly less expensive to manufacture than a static RAM.

BRIEF DESCRIPTION OF THE DRAWINGS

FIG. 5 shows timing diagrams for the logic circuitry and word lines shown in FIG. 4.

DESCRIPTION OF THE PREFERRED EMBODIMENT

Figure 1:
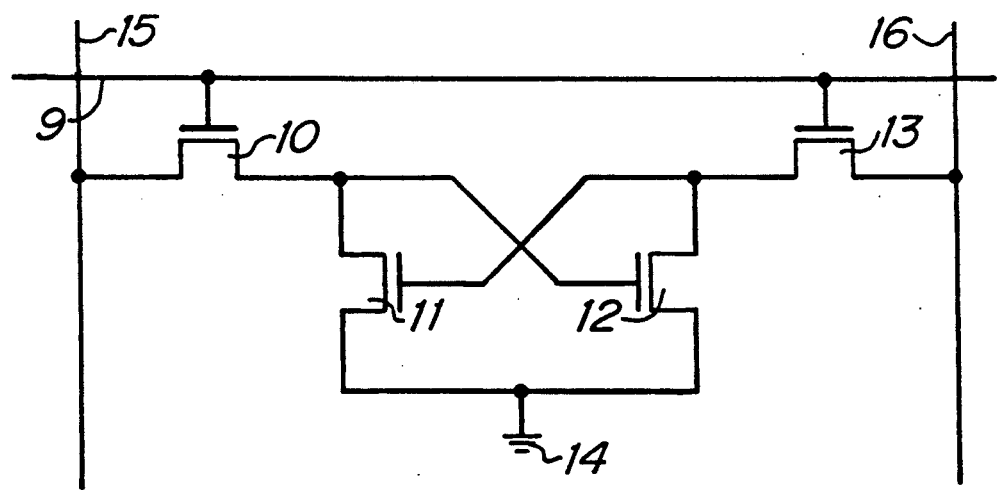
FIG. 1 shows a schematic of a four-transistor memory cell for a DRAM.

FIG. 1 shows a schematic of four-transistor memory cell used in a DRAM. A transistor 11 and a transistor 12 are cross-coupled so that the value stored at the gate of transistor 11 is the inverse of the value stored at the gate of transistor 12. That is, when the gate of transistor 11 is at logic 1, the gate of transistor 12 is at logic 0, and similarly, when the gate of transistor 11 is at logic 0, the gate of transistor 12 is at logic 1. The source of transistor 11 and the source of transistor 12 are connected to a ground 14.

When a word line 9 is at logic 1, a transistor 10 is turned on electrically connecting a bit line 15 to the gate of transistor 12 and the drain of transistor 11. Also, when word line 9 is at logic 1, a transistor 13 is turned on electrically connecting a bit_B line 116 to the gate of transistor 11 and the drain of transistor 12. When word line 9 is at logic 0, transistor 10 isolates bit line 15 from transistor 11 and transistor 12. Similarly, when word line 9 is at logic 0, transistor 13 isolates bit_B line 16 from transistor 11 and transistor 12.

In order to read from the memory cell shown in FIG. 1, word line 9 is at logic 1. The memory value stored in the memory cell may then be read from bit line 15 and the inverse of the memory value stored in the memory cell may be from bit_B line 16. In order to write to the memory cell shown in FIG. 1, the memory value to be stored in the memory cell is placed on bit line 15 and the inverse of the memory value to be stored in the memory cell is placed on bit_B line 16. Word line 9 is then asserted to logic 1.

Impedance across transistor 10, transistor 11, transistor 12 and transistor 13 are selected so that values currently stored within the memory cell may be refreshed by placing a logic 1 on bit line 15, placing a logic 1 on bit_B line 16 and then asserting word line 9 to logic 1.

Memory cells are arranged on a DRAM chip in rows and columns. Each row of memory cells has associated with it a word line. Each column of memory cells has associated with it a bit line and a bit_B line. A row of memory cells is selected by placing a logic 1 on the word line for the row. Once the memory cell is selected, a memory cell within the row may be read by detecting the values on its bit line and/or bit_B line, alternately, a memory cell within the row may be written to or refreshed by placing appropriate values on its bit line and bit_B line. Because a single bit line and bit_B line are used for all the memory cells in a column, only one memory cell per column may be read from at a time. This means that when reading, only one row of memory cells at a time may be selected by raising its word line to logic 1. However, the number of rows of memory cells selected during a refresh cycle is only limited by the power limitations of the DRAM chip. Similarly, more than one memory cell from a column of memory cells may be written to simultaneously provided the same value is to be written into the memory cells in each column. In the present design, however, only one row of memory cells is written to at a time.

Figure 2:
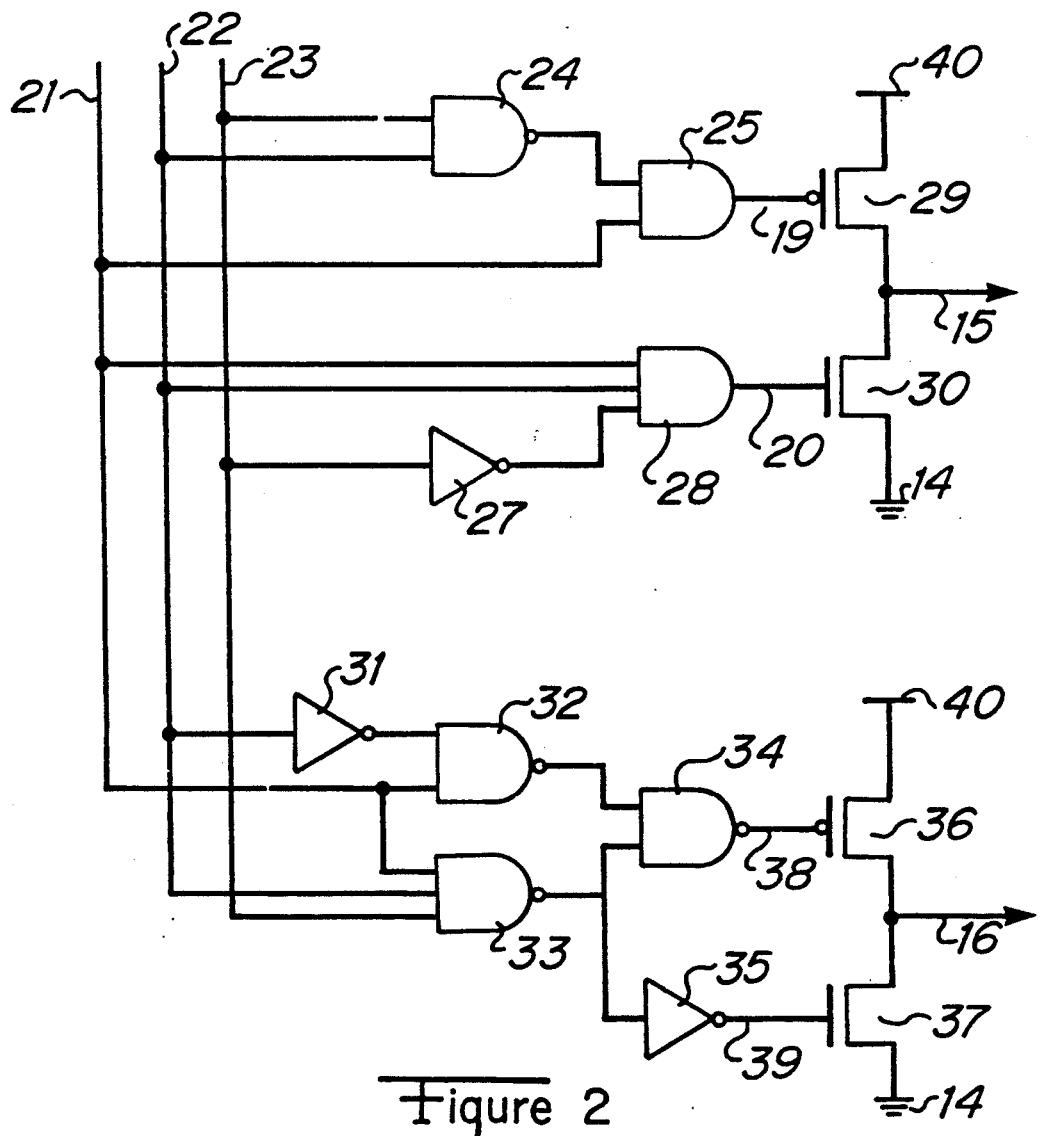
FIG. 2 shows a schematic of logic circuitry which controls bit lines used to access and refresh the four-transistor memory cells of a DRAM in accordance with the preferred embodiment of the present invention.

FIG. 2 shows a schematic of logic circuitry which controls bit line 15 and bit_B line 16. The logic circuitry acts so that memory cells, such as that shown in FIG. 11, may be continuously refreshed without interfering with memory accesses. A refresh_B signal 121 (shown in FIG. 4) is placed on a refresh line 21. A read_B/write signal 122 (shown in FIG. 4) is placed on a read/write line 22. A data signal 123 (shown in FIG. 4) which indicates data to be written into a memory cell is placed on data line 23.

A transistor 29 connects bit line 15 to a power signal 40 (logic 1) when a gate 19 of transistor 29 is at logic 0. Similarly, a transistor 30 connects bit line 15 to ground 14 (logic 0) when a gate 20 of transistor 30 is at logic 1. A logic gate 24, and a logic gate 25 control when transistor 29 is turned on and thus connects bit line 15 to power signal 40.

Transistor 29 is turned on when both read_B/write signal 122 and data signal 123 are at logic 1. Also, transistor 29 is turned on when refresh_B signal 121 is at logic 0 (i.e., during a refresh cycle). Otherwise transistor 29 is off.

A logic gate 27 and a logic gate 28 control when transistor 30 is turned on and thus connects bit line 15 to ground 14. Transistor 30 is turned on when read_B/write signal 122 is at logic 1, data signal 123 is at logic 0 and refresh_B signal 121 is at logic 1. Otherwise transistor 30 is off.

A transistor 36 connects bit_B line 16 to power signal 40 when a gate 38 of transistor 36 is at logic 0. Similarly, a transistor 37 connects bit_B line 16 to ground 14 when a gate 39 of transistor 37 is at logic 1.

A logic gate 31, a logic gate 32, a logic gate 33 and a logic gate 34 control when transistor 36 is turned on and thus connects bit_B line 16 to power signal 40. Transistor 36 is turned on when read_B/write signal 122 is at logic 1 and data signal 123 is at logic 0. Also, transistor 36 is turned on when refresh_B signal 121 is at logic 0 (i.e., during a refresh cycle). Otherwise transistor 36 is turned off.

Logic gate 33 and a logic gate 35 control when transistor 37 is turned on and thus connects bit_B line 16 to ground 14. Transistor 37 is turned on when read_B/write signal 122 is at logic 1, data signal 123 is at logic 1 and refresh_B signal 121 is at logic 1. Otherwise transistor 37 is turned off.

Figure 3:
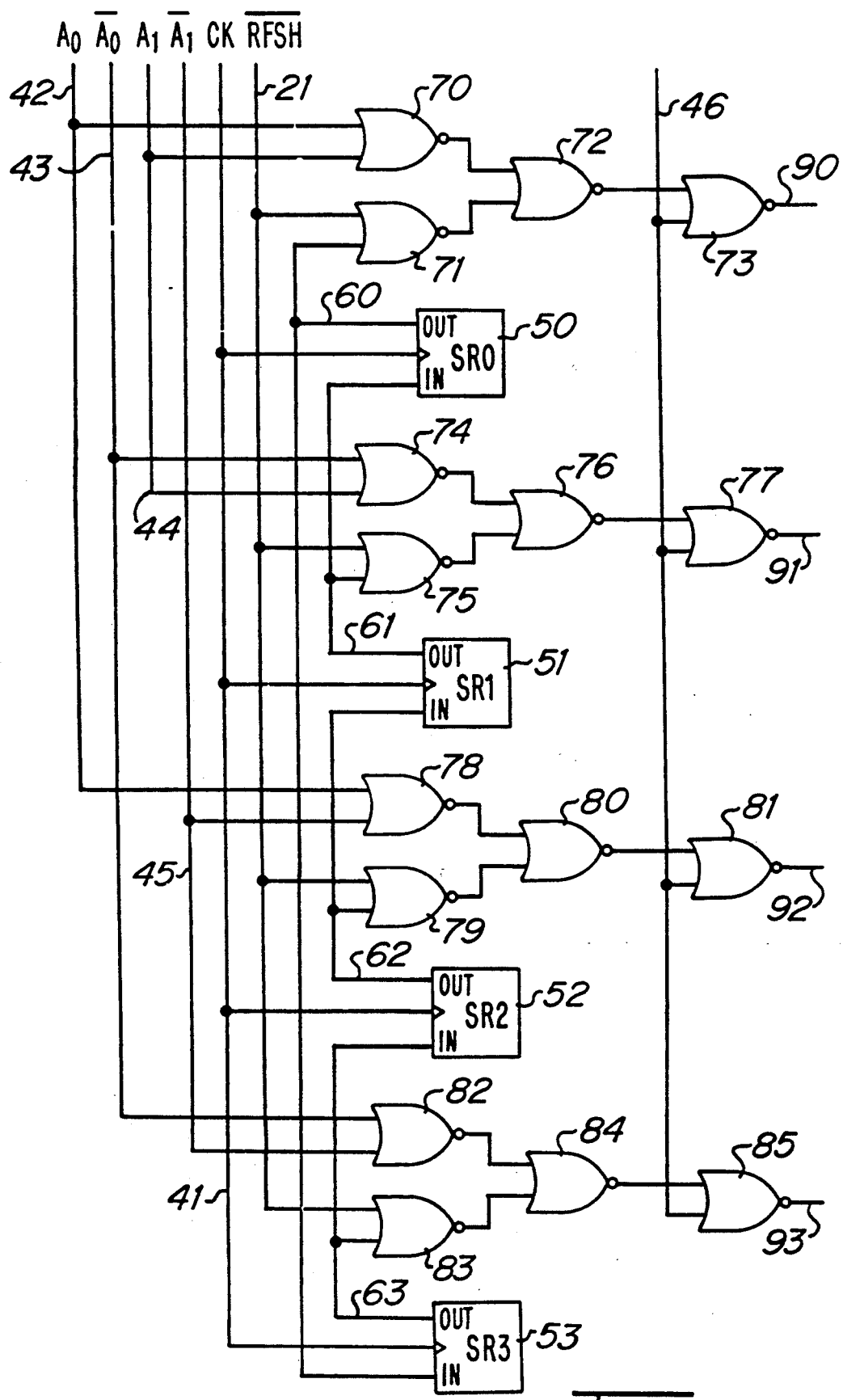
FIG. 3 shows a schematic of logic circuitry which controls word lines used to access and refresh the four-transistor memory cells of a DRAM in accordance with the preferred embodiment of the present invention.

FIG. 3 shows a schematic of logic circuitry which controls the value of signals on a word line 910, a word line 91, a word line 92 and a word line 93. Word lines 90–93 are used to to select four-transistor memory cells such as those shown in FIG. 1 for the purpose of reading from, writing to or refreshing the memory cells.

A word address is placed on an $A_0$ address line 42 and an $A_1$ address line 44. An inverted word address is placed on an inverted $A_0$ address line 43 and an inverted $A_1$ address line 45. Each word line 90 through 93 has a unique address associated with it.

A clock signal 141 (shown in FIGS. 4 and 5) is placed on a clock line 41. Clock signal 141 may, for example, be a system clock signal which a DRAM chip receives through a dedicated pin. Refresh_B signal 121 is placed on refresh line 21. A start signal 146 (shown in FIGS. 4 and 5) is placed on a start line 46. When start signal 146 is at logic 1, the word signal on each of word lines 90–93 is at logic 0. When start signal 146 is at logic 0, the signals on word lines 90–93 are in a normal operating mode.

A shift register consists of a one-bit shifter 50, a one-bit shifter 51, a one-bit shifter 52 and a one-bit shifter 53. One-bit shifter 50 has a shift output 60. One-bit shifter 51 has a shift output 61. One-bit shifter 52 has a shift output 62. One-bit shifter 53 has a shift output 63. On one of shift outputs 60–63 is placed a logic 0. On each of the other shift outputs 60–63 is placed a logic 1. One-bit shifters 50-53 respond to clock signal 141 to shift the location of the logic 0 for each clock signal.

Logical circuitry controls the signal placed on each of word lines 90-93. A logical gate 70, a logical gate 71, a logical gate 72 and a logical gate 73 select the signal for word line 90. A logical gate 74, a logical gate 75, a logical gate 76 and a logical gate 77 sellect th1e signal for word line 91. A logical gate 78, a logical gate 79, a logical gate 80 and a logical gate 81 select the signal for word line 92. A logical gate 82, a logical gate 83, a logical gate 84 and a logical gate 85 select the signal for word line 93.

The logical circuitry for each word line selects the word line to be at logic 1 when the word line is addressed by address lines 42-45. A word line is additionally selected during a refresh cycle when there is a logic 0 on the shift output for a one-bit shifter associated with word line.

For example, as long as start signal 146 on start line 46 is at logic 0, the value for a signal on each of the word lines 90-93 is as follows. Word line 90 is at logic 1 when $A_0$ address line 42 and $A_1$ address line 44 are at logic 0. Additionally, word line 90 is at logic 1 when shift output 60 of one-bit shifter 50 is at logic 0 and refresh_B signal 121 on refresh line 21 is at logic 0. Otherwise, word line 90 is at logic 0.

Word line 91 is at logic 1 when inverted $A_0$ address line 43 and $A_1$ address line 44 are at logic 0. Additionally, word line 91 is at logic 1 when shift output 61 of one-bit shifter 51 is at logic 0 and refresh_B signal 121 on refresh line 21 is at logic 0. Otherwise, word line 91 is at logic 0.

Word line 92 is at logic 1 when $A_0$ address line 42 and inverted $A_1$ address line 45 are at logic 0. Additionally, word line 92 is at logic 1 when shift output 62 of one-bit shifter 52 is at logic 0 and refresh_B signal 121 on refresh line 21 is at logic 0. Otherwise, word line 90 is at logic 0.

Word line 93 is at logic 1 when inverted $A_0$ address line 43 and inverted $A_1$ address line 45 are at logic 0. Additionally, word line 93 is at logic 1 when shift output 63 of one-bit shifter 53 is at logic 0 and refresh_B signal 121 on refresh line 21 is at logic 0. Otherwise, word line 90 is at logic 0.

In FIG. 3. logic circuitry is shown for selecting a word line using a two-bit address. Typically, a DRAM integrated circuit contains substantially more word lines. However, the logic circuitry herein described for the case of a two-bit address is readily applicable to any size DRAM. The shift register is expanded to include a one-bit shifter for every word line. Additionally, if it is desired to refresh more than one row of memory cells at a time, additional logic 0s may be placed on the output of one-bit shifters so that more than one logic 0 is being circulated by the shift register.

Figure 4:
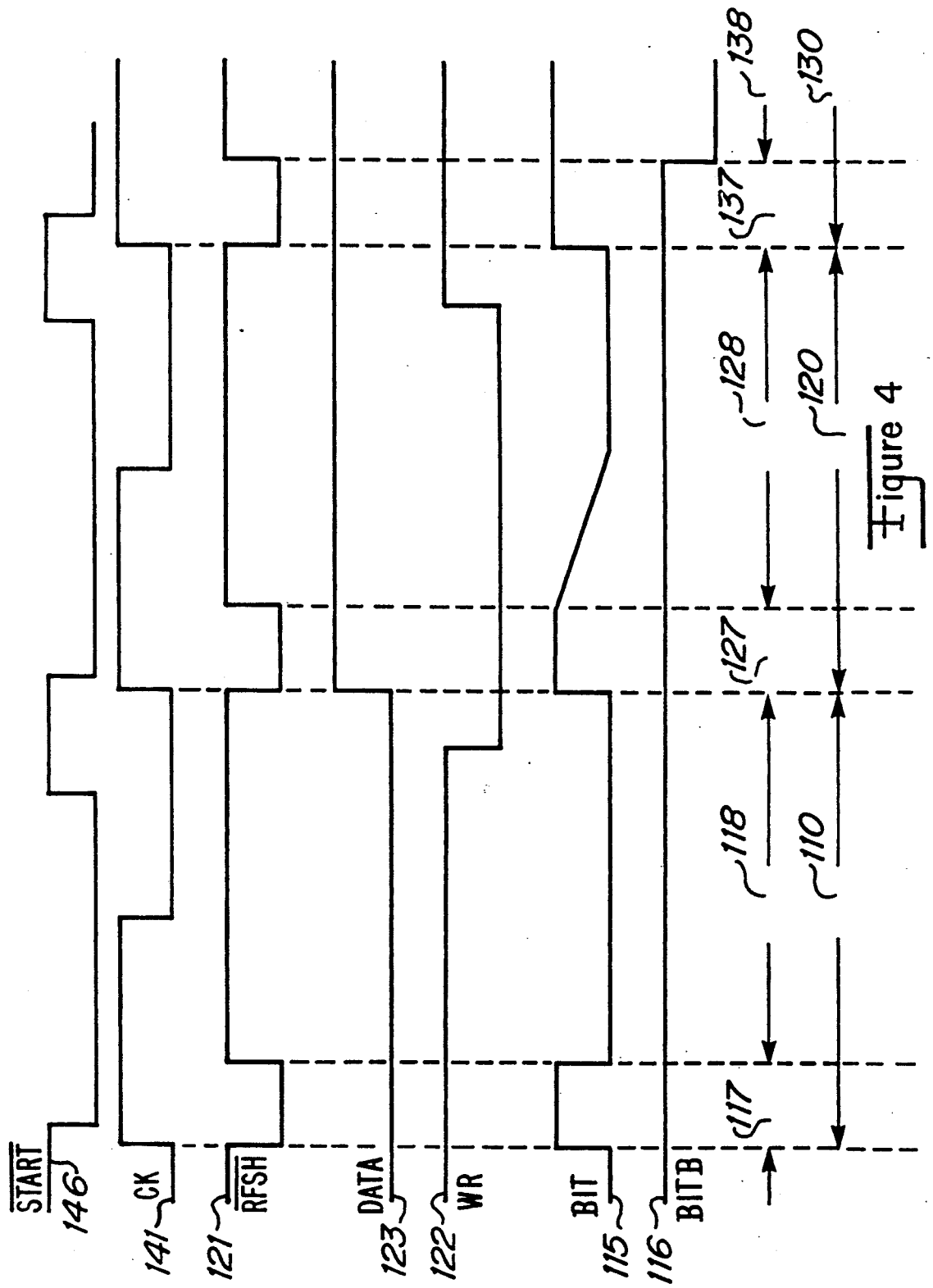
FIG. 4 shows timing diagrams for the logic circuitry and bit lines shown in FIG. 2.

FIG. 4 shows timing diagrams for the logic circuitry shown in FIG. 2. A clock signal 141 may, for example, be a system clock signal which a DRAM chip receives through a dedicated pin. A refresh_B signal 121 is at logic 0 during a refresh cycle at the beginning of each cycle of clock signal 141. For a system clock cycle of 50 nanoseconds, a refresh cycle may be, for example, ten nanoseconds. During the refresh cycle, the memory cells with selected words lines are refreshed. During the rest of the cycle, memory cells may be read from or written to.

For example, sample values of signals are given for a clock cycle 110 during which a data value of "0" is written into a memory cell. Additionally, sample values of signals are given for a clock cycle 120 during which a data value of "0" is read from a memory cell. Finally, sample values of signals are given for a clock cycle 130 during which a data value of "1" is written to a memory cell.

Immediately before clock cycle 110, refresh_B signal 121 is at logic 1, indicating that no memory cells are being refreshed. Data signal 123 is at logic 0 indicating a logic 0 is ready to be written into a selected memory cell. Read_B/write signal 122 is at logic 1 indicating a write operation is to be performed. Based on the values of data signal 123, read_B/write signal 122 and refresh_B signal 121, the logical circuitry shown in FIG. 2 holds bit signal 115 at logic 0 and bit_B signal at logic 1.

During a refresh segment 117 of clock cycle 110, refresh_B signal 121 is at logic 0. The logic circuitry shown in FIG. 2 then places a logic 1 on bit signal 115 and bit_B signal 116. During the refresh segment 117 of clock cycle 110, memory cells are refreshed in every row for which a word line is at logic 1.

When refresh segment 117 is complete, refresh_B signal 121 is at logic 1. The logic circuitry shown in FIG. 2 then places a logic 0 on bit signal 115 and a logic 1 on bit_B signal 116. Then, during a segment 118 of clock cycle 110, the data is written to the row of memory cells selected by the word line. Toward the end of segment 118, the start signal on start line 46 is raised to logic 1. Then the read_B/write signal 122 on read/write line 22 may be changed to set up for the next operation.

Immediately before clock cycle 120, refresh_B signal 121 is at logic 1, indicating that no memory cells are being refreshed. Read B/write signal 122 is at logic 0 indicating a read operation is to be performed. Based on the values of read_B/write signal 122 and refresh_B signal 121, the logical circuitry shown in FIG. 2 allows bit signal 115 to remain at logic 0 and bit_B signal to remain at logic 1.

During a refresh segment 127 of clock cycle 120, refresh_B signal 121 is at logic 0. The logic circuitry shown in FIG. 2 then places a logic 1 on bit signal 115 and bit_B signal 116. During the refresh segment 127 of clock cycle 120, memory cells are refreshed in every row for which a word line is at logic 1.

When refresh segment 127 is complete, refresh_B signal 121 is at logic 1. The logic circuitry shown in FIG. 2 then allows the signal values of bit signal 115 and bit_B signal 116 to be determined by the values in the selected memory cell. During a data access segment 128 of clock cycle 120, bit_B signal 116 stays at logic 1 and bit signal 115 returns to logic 0. The values of bit signal 115 and bit_B signal 116 may be read to determine the value stored by the selected memory cell. As may be seen, the refresh cycle serves also as pre-charge for a read cycle. Toward the end of segment 118, start signal 146 on start line 46 is raised to logic 1. Then the read_B/write signal 122 on read/write line 22 may be changed to set up for the next operation.

Immediately before clock cycle 130, refresh_B signal 121 is at logic 1, indicating that no memory cells are being refreshed. Data signal 123 is at logic 1 indicating a logic 1 is ready to be written into a selected memory cell. Read_B/write signal 122 is at logic 1 indicating a write operation is to be performed. Based on the values of data signal 123, read_B/write signal 122 and refresh_B signal 121, the logical circuitry shown in FIG. 2 holds bit signal 115 at logic 0 and bit_B signal at logic 1.

During a refresh segment 137 of clock cycle 130, refresh_B signal 121 is at logic 0. The logic circuitry shown in FIG. 2 then places a logic 1 on bit signal 115 and bit_B signal 116. During the refresh segment 137 of clock cycle 130, memory cells are refreshed in every row for which a word line is at logic 1.

When refresh segment 137 is complete, refresh_B signal 121 is at logic 1. The logic circuitry shown in FIG. 2 then places a logic 1 on bit signal 115 and a logic 0 on bit_B signal 116. During a segment 118 of clock cycle 110, the data is written to the row of memory cells selected by the word line.

FIG. 5 shows timing diagrams for logic circuitry shown in FIG. 3. During clock cycle 110, an $A_0$ address signal 142 on $A_0$ address line 42 is at logic 0, and an $A_1$ address signal 144 on $A_1$ address line 44 is at logic 0. Therefore, the logic circuitry shown in FIG. 3 selects a word signal 190 on word line 90 to be at logic 1. Since a word signal 191 for word line 191 is not selected, word signal 191 is at logic 0 during clock cycle 110. A shift output signal 160 on shift output 60 and a shift output signal 161 on shift output 61 are at logic 1. Therefore, during refresh segment 117 of clock cycle 110, refresh_B signal 121 does not cause either of word signal 190 or word signal 191 to be raised to logic 1. Nevertheless, since address lines 142 and 144 have selected word line 190 to be at logic 1, the memory cells in the row selected by word line 190 will be refreshed. Also, the word line whose associated shift output is at logic 0 will also be refreshed during refresh cycle 117.

During clock cycle 120, $A_0$ address signal 142 is at logic 1 and $A_1$ address signal 144 is at logic 0. Therefore, the logic circuitry shown in FIG. 3 selects word signal 191 to be at logic 1. Shift output signal 161 is at logic 0 indicating the memory cells along the row of memory cells selected by word signal 191 are due to be refreshed during refresh cycle 127. Since word line 91 is selected by the address lines, word signal 191 remains at logic 1 even after refresh cycle 127 is completed.

During clock cycle 130, $A_0$ address signal 142 is at logic 0 and $A_1$ address signal 144 is at logic 1. Therefore, the logic circuitry shown in FIG. 3 selects neither word signal 190 nor word signal 191 to be at logic 1. Shift output signal 160 is at logic 0 indicating the memory cells along the row of memory cells selected by word signal 190 are due to be refreshed. Therefore, during refresh cycle 137, word signal 190 is at logic 1 causing the memory cells in the row selected by word line 90 to be refreshed. However, since word line 90 is not selected by the address lines, word signal 190 returns to logic 0 after refresh cycle 137 is completed.

The timing diagrams in FIG. 4 and FIG. 5 are shown to give an overview of the timing of the preferred embodiment of the present invention. As is understood in the art, slight adjustments would typically be made to the timing of the signals in order to take into account the time necessary for signals to settle on a line and to provide time for the set-up of signals. For example, in FIG. 4 and in FIG. 5, the falling edge of refresh_B signal 121 would typically be slightly delayed from the rising edge of clock signal 141. Similarly, start signal 146 on start line 46 could be derived, for example, by inverting and slightly delaying clock signal 141.

The preferred embodiment of the present invention has been described with the assumption that a data acces is performed on every clock cycle. However, in normal operation, a data access is generally not performed on every clock cycle. The present system may take this into account in a number of ways. For example, during a clock cycle in which a data access is not required, a read operation can be performed on any address, and the read data may then be ignored. That is, during the data access segment of a clock cycle, read_B/write signal 122 is placed at logic 0, word lines 90 through 93 are held at a stable value, and the information on bit line 15 and bit_B line 16 is ignored or discarded.

We claim:

1. A random access memory having a plurality of memory cells which are refreshed responsive to a clock signal, the clock signal having a clock cycle and the random access memory comprising:
   address selection means, coupled to the plurality of memory cells, for selecting a first subset of the plurality of memory cells for data access;
   refresh selection means, coupled to the plurality of memory cells, for selecting a second subset of the plurality of memory cells to be refreshed; and,
   refresh means, coupled to the plurality of memory cells, for, during a first segment of the clock cycle, refreshing data stored in the first subset of the plurality of memory cells selected by the address selection means and for, during the first segment of the clock cycle, refreshing data stored in the second subset of the plurality of memory cells selected by the refresh selection means;
   wherein a data access to the first subset of the plurality of memory cells is performed in a second segment of the clock cycle, the second segment of the clock cycle occurring after the first segment of the clock cycle.

2. A random access memory as in claim 1 wherein the refresh selection means includes a shift register, wherein data stored in the shift register determines which memory cells are selected by the refresh selection means, and wherein the data stored in the shift register is shifted once every clock cycle.

3. A random access memory having a plurality of memory cells which are refreshed responsive to a clock signal, the clock signal having a clock cycle and the random access memory comprising:
   address selection means, coupled to the plurality of memory cells, for selecting a first subset of the plurality of memory cells for data access;
   refresh selection means, coupled to the plurality of memory cells, for selecting a second subset of the plurality of memory cells to be refreshed, the refresh selection means including a shift register, data stored in the shift register determining which memory cells are selected by the refresh selection means, and the data stored in the shift register being shifted once every clock cycle; and,
   refresh means, coupled to the plurality of memory cells, for, during a first segment of the clock cycle, refreshing data stored in the first subset of the plurality of memory cells selected by the address selection means and for, during the first segment of the clock cycle, refreshing data stored in the second subset of the plurality of memory cells selected by the refresh selection means; wherein
   the plurality of memory cells are arranged in rows, each row being selected by a signal placed on a word line for that row;

the refresh selection means selects the second subset of the plurality of memory cells by selecting a word line for at least one row containing the second subset of the plurality of memory cells; and, for each word line, the shift register includes a one-bit shifter, the refresh selection means selecting a word line based on a value stored in the one-bit shifter for the word line.

4. A random access memory as in claim 1 wherein during a second segment of the clock cycle, a data access is performed on the first subset of the plurality of memory cells.

5. A random access memory as in claim 1 wherein the clock signal is generated external to the random access memory.

6. A random access memory as in claim 1 wherein the clock signal is generated from a system clock of a computing system which includes the random access memory.

7. A method for refreshing a plurality of memory cells within a random access memory responsive to a clock signal having a clock cycle, the method comprising the steps of:

(a) selecting a first subset of the plurality of memory cells for data access;

(b) selecting a second subset of the plurality of memory cells for refresh;

(c) during a first segment of the clock cycle, refreshing the first subset of the plurality of memory cells selected in step (a) and refreshing the second subset of the plurality of memory cells selected in step (b); and, (d) during a second segment of the clock cycle, performing a data access to the first subset of the plurality of memory cells, wherein the second segment of the clock cycle occurs after the first segment of the clock cycle.

8. A method as in claim 7 additionally comprising the step of:

(e) before each clock cycle of the clock signal, selecting a new subset of the plurality of memory cells to be the second subset of the plurality of memory cells.

9. A method as in claim 8 wherein step (e) is performed by shifting data in a shift register.

10. A method as in claim 9 wherein the plurality of memory cells are arranged in rows, each row being selected by a signal placed on a word line for that row; and step (b) includes selecting a word line for at least one row which contains the second subset of the plurality of memory cells.

11. A method as in claim 7 additionally comprising:

(e) generating the clock signal external to the random access memory.

12. A method as in claim 7 wherein in step (e) the clock signal is generated from a system clock of a computing system which includes the random access memory.

13. A random access memory having a plurality of memory cells arranged in rows and columns being accessed by a bit line and a bit__B line, the random access memory comprising:

word selection means, coupled to word lines for the plurality of memory cells, for, during a clock cycle, selecting a word line of a row of memory cells for data access and for, during a refresh segment of the clock cycle, selecting at least one word line of a row of memory cells for refresh; and, refresh means, coupled to bit lines and bit__B lines for the plurality of memory cells, for during the refresh segment of the clock cycle, placing a refresh signal on every bit line and bit__B line;

wherein a data access to the first subset of the plurality of memory cells is performed in a data access segment of the clock cycle, the data access segment of the clock cycle occurring after the refresh segment of the clock cycle.

14. A random access memory as in claim 13 wherein after the refresh segment of the clock cycle, the word selection means selects only the word lines of the row of memory cells for data access.

15. A random access memory as in claim 13 wherein the word selection means includes:

a shift register, wherein data stored in the shift register selects the at least one word line of the row of memory cells for refresh.

16. A random access memory as in claim 15 wherein for each word line, the shift register includes a one-bit shifter, the word selection means selecting the at least one word line of the row of memory cells for refresh based on a value stored in a one-bit shifter for each of the at least one word line.

17. A random access memory as in claim 13 additionally comprising:

read/write signal generating means, coupled to bit lines and bit__B lines for the plurality of memory cells, for controlling the bit lines and the bit__B lines in order to, during a data access segment of the clock cycle, perform data access on the row of memory cells selected for data access.

18. A random access memory as in claim 13 wherein the clock cycle is generated by a clock signal originating external to the random access memory.

19. A random access memory as in claim 18 wherein the clock signal is generated from a system clock of a computing system which includes the random access memory.

* * * * *